US009059281B2

United States Patent
Brochu, Jr. et al.

(10) Patent No.: US 9,059,281 B2
(45) Date of Patent: Jun. 16, 2015

(54) DUAL L-SHAPED DRIFT REGIONS IN AN LDMOS DEVICE AND METHOD OF MAKING THE SAME

(71) Applicant: International Business Machines Corporation, Armonk, NY (US)

(72) Inventors: David G. Brochu, Jr., East Hardwick, VT (US); John J. Ellis-Monaghan, Grand Isle, VT (US); Michael J. Hauser, Bolton, VT (US); Jeffrey B. Johnson, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 13/939,353

(22) Filed: Jul. 11, 2013

(65) Prior Publication Data

US 2015/0014771 A1  Jan. 15, 2015

(51) Int. Cl.
| | |
|---|---|
| H01L 29/66 | (2006.01) |
| H01L 29/78 | (2006.01) |
| H01L 29/732 | (2006.01) |
| H01L 29/08 | (2006.01) |
| H01L 21/8249 | (2006.01) |
| H01L 27/06 | (2006.01) |

(52) U.S. Cl.
CPC ...... *H01L 29/7833* (2013.01); *H01L 29/66681* (2013.01); *H01L 29/732* (2013.01); *H01L 29/0821* (2013.01); *H01L 21/8249* (2013.01); *H01L 27/0623* (2013.01)

(58) Field of Classification Search
None
See application file for complete search history.

(56) References Cited

U.S. PATENT DOCUMENTS

| | | | |
|---|---|---|---|
| 6,870,222 B2 | 3/2005 | Kim et al. | |
| 6,897,525 B1 | 5/2005 | Kikuchi et al. | |
| 7,560,774 B1 | 7/2009 | Liu et al. | |
| 8,174,070 B2 | 5/2012 | Mallikarjunaswamy | |

(Continued)

FOREIGN PATENT DOCUMENTS

| | | |
|---|---|---|
| CN | 102646712 A | 8/2012 |
| CN | 102054864 B | 10/2012 |

(Continued)

OTHER PUBLICATIONS

Kim et al., "Trenched Sinker LDMOSFET (TS-LDMOS) Structure for High Power Amplifier Application above 2 GHz" International Electron Devices Meeting, 2001, IEDM '01, Technical Digest [online], [retrieved on Aug. 20, 2012]. Retrieved from the Internet <URL: http://ieeexplore.ieee.org/stamp/stamp.jsp?tp=&arnumber=979655&isnumber=21092>.

*Primary Examiner* — Charles Garber
*Assistant Examiner* — Brigitte Paterson
(74) *Attorney, Agent, or Firm* — Edwards P. Li

(57) ABSTRACT

A semiconductor device comprising dual L-shaped drift regions in a lateral diffused metal oxide semiconductor (LDMOS) and a method of making the same. The LDMOS in the semiconductor device comprises a trench isolation region or a deep trench encapsulated by a liner, a first L-shaped drift region, and a second L-shaped drift region. The LDMOS comprising the dual L-shape drift regions is integrated with silicon-germanium (SiGe) technology. The LDMOS comprising the dual L-shape drift regions furnishes a much higher voltage drop in a lateral direction within a much shorter distance from a drain region than the traditional LDMOS does.

17 Claims, 12 Drawing Sheets

(56) References Cited

U.S. PATENT DOCUMENTS

| | | |
|---|---|---|
| 8,198,677 B2 | 6/2012 | Wilson et al. |
| 2005/0090049 A1 | 4/2005 | Abadeer et al. |
| 2007/0063271 A1* | 3/2007 | Takimoto et al. ............. 257/330 |
| 2007/0108517 A1 | 5/2007 | Wu et al. |
| 2009/0294849 A1* | 12/2009 | Min et al. ...................... 257/337 |
| 2012/0175673 A1 | 7/2012 | Lee |
| 2012/0235143 A1* | 9/2012 | Cai et al. ......................... 257/51 |

FOREIGN PATENT DOCUMENTS

| | | |
|---|---|---|
| CN | 102709325 A | 10/2012 |
| CN | 102790086 A | 11/2012 |

* cited by examiner

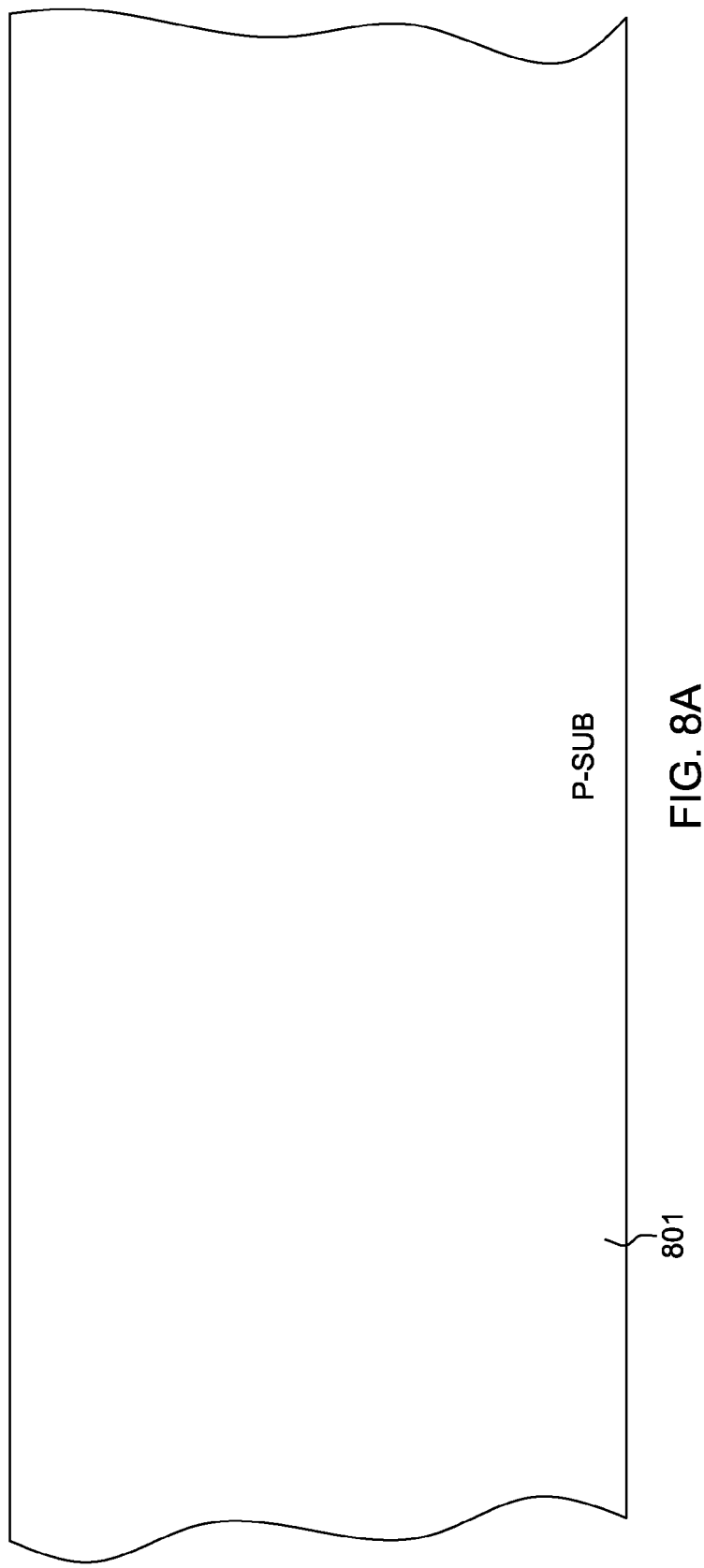

DUAL L-SHAPED DRIFT REGIONS IN AN LDMOS DEVICE AND METHOD OF MAKING THE SAME

FIELD OF THE INVENTION

The present invention relates generally to semiconductors, and more particularly to dual L-shaped drift regions in an LDMOS device and a method of making the same.

BACKGROUND

The integration of an LDMOS with silicon-germanium (SiGe) technology has gained attention for power management and automotive applications. The LDMOS device is used in a RF/microwave power amplifier. The LDMOS is fabricated on a silicon substrate or on a silicon-on-insulator (SOI) substrate. Such a silicon-based FET is widely used in power management and power amplifiers where high voltage input and output are required and regulated. The integration of an LDMOS with silicon-germanium (SiGe) technology is an evolved semiconductor technology that integrates two formerly separate semiconductor technologies, the silicon-germanium (SiGe) BiCMOS technology and the high voltage CMOS transistor—in a single integrated circuit.

A traditional LDMOS (laterally diffused metal oxide semiconductor) device usually uses a horizontal drift region between a drain region and a gate region to drop high voltage which causes the LDMOS device to burn out. When the voltage drop goes as high as 120V and higher, the length of the drift region is typically required longer than 6 µm. Such a long drift region occupies a huge area in the LDMOS device. Also, in the traditional LDMOS process, the drift region doping is doped uniformly across the region laterally and is sometimes shared with well doping; therefore, it is difficult to independently tune the electrical field laterally for the purpose of achieving the best performance of both blocking voltage and on-resistance.

SUMMARY

Embodiments of the present invention disclose a semiconductor device. The semiconductor device comprises a lateral diffused metal oxide semiconductor (LDMOS). The LDMOS comprises, in a first well with a first conductivity type, a trench isolation region or a deep trench encapsulated by a liner, a first L-shaped drift region, and a second L-shaped drift region. The trench isolation region or the deep trench surrounds a drain region and extends down in the first well in a substantially vertical direction. The first L-shaped drift region comprises a first section and a second section. The first section extends in a substantially lateral direction. A first end of the first section is adjacent to the trench isolation region or the deep trench, and a second end of the first section extends to a second well with a second conductivity type. The second well surrounds a body region and a source region. The second section extends down in the first well in the substantially vertical direction and is parallel to the trench isolation region or the deep trench. An upper end of the second section connects to the first end of the first section. The second L-shaped drift region comprises a third section and a fourth section. The third section extends in the substantially lateral direction and below a lower end of the trench isolation region or the deep trench. A first end of the third section connects to a lower end of the second section. The fourth section extends in the substantially vertical direction and is surrounded by a lower section of the trench isolation region or the deep trench. A lower end of the fourth section connects to a second end of the third section.

Embodiments of the present invention disclose a method of making a lateral diffused metal oxide semiconductor (LDMOS) that comprises dual L-shaped drift regions. The method comprises a step of forming a trench isolation region or a deep trench encapsulated by a liner. The trench isolation region or the deep trench is formed in a first well with a first conductivity type. The trench isolation region or the deep trench surrounds a drain region and extends down in the first well in a substantially vertical direction. The method comprises a step of forming a first L-shaped drift region in the first well. The first L-shaped drift region includes a first section and a second section. The first section extends in a substantially lateral direction. A first end of the first section is adjacent to the trench isolation region or the deep trench and a second end of the first section extends to a second well with a second conductivity type. The second well surrounds a body region and a source region. The second section extends down in the first well in the substantially vertical direction and is parallel to the trench isolation region or the deep trench. An upper end of the second section connects to the first end of the first section. The method further comprises a step of forming a second L-shaped drift region in the first well. The second L-shaped drift region includes a third section and a fourth section. The third section extends in the substantially lateral direction and is below a lower end of the trench isolation region or the deep trench. A first end of the third section connects to a lower end of the second section. The fourth section extends in the substantially vertical direction and is surrounded by a lower section of the trench isolation region or the deep trench. A lower end of the fourth section connects to a second end of the third section.

BRIEF DESCRIPTION OF THE SEVERAL VIEWS OF THE DRAWINGS

FIGS. 8A-8F are diagrams showing a process of making a BiCMOS device shown in FIG. 2, in accordance with an exemplary embodiment in the present invention.

DETAILED DESCRIPTION

The present invention discloses a new LDMOS structure integrated with BiCMOS technology and a method of making the same. The present invention is described in detail in the following exemplary embodiments with reference to the figures. The foregoing description of various exemplary embodiments of the present invention has been presented for purposes of illustration and description. It is neither intended to be exhaustive nor to limit the invention to the precise form disclosed. Many modifications and variations are possible. Such modifications and variations that may be apparent to a person skilled in the art of the invention are intended to be included within the scope of the invention as defined by the accompanying claims.

It is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

In this document, a lateral direction is defined as a direction parallel to a top surface of a semiconductor substrate and a vertical direction is defined as a direction perpendicular to a top surface of a semiconductor substrate.

Figure 1:
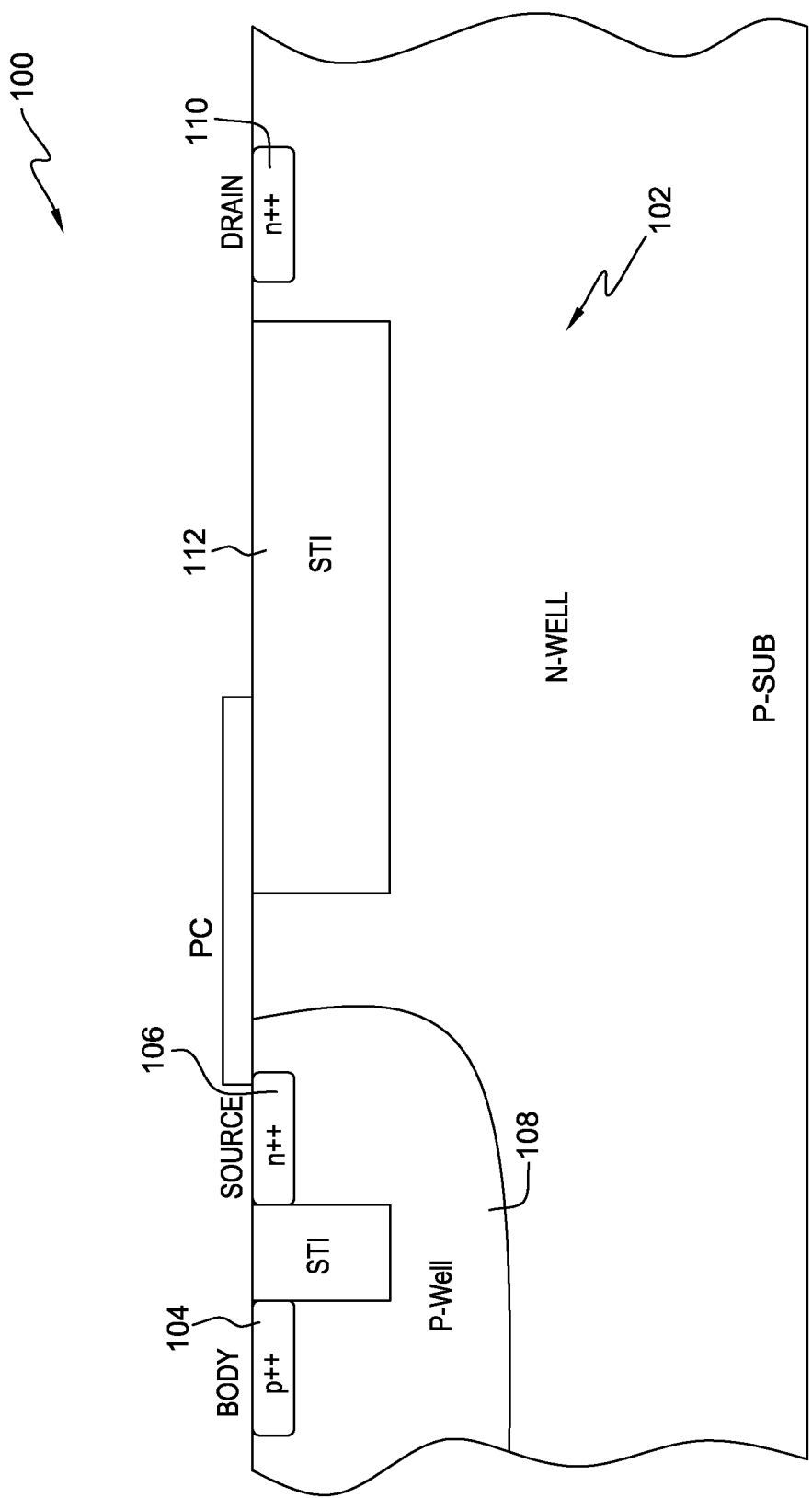
FIG. 1 is a diagram illustrating a traditional LDMOS in prior art.

FIG. 1 is a diagram illustrating traditional LDMOS 100 in prior art. Extended drift region 102 is located bellow shallow trench isolation (STI) 112, and between N-type drain 110 and P-well 108 which is below P-type body contact region 104 and N-type source region 106. Extended drift region 102 extends laterally. The length of extended drift region 102 is typically longer than 6 μm if the voltage drop is 120V or higher. In order to prevent LDMOS 100 from being burned out by a high voltage, extend drift region 102 must be long enough to drop the high voltage. Thus, extended drift region 102 occupies a huge area in a traditional LDMOS 100 layout.

Figure 2:
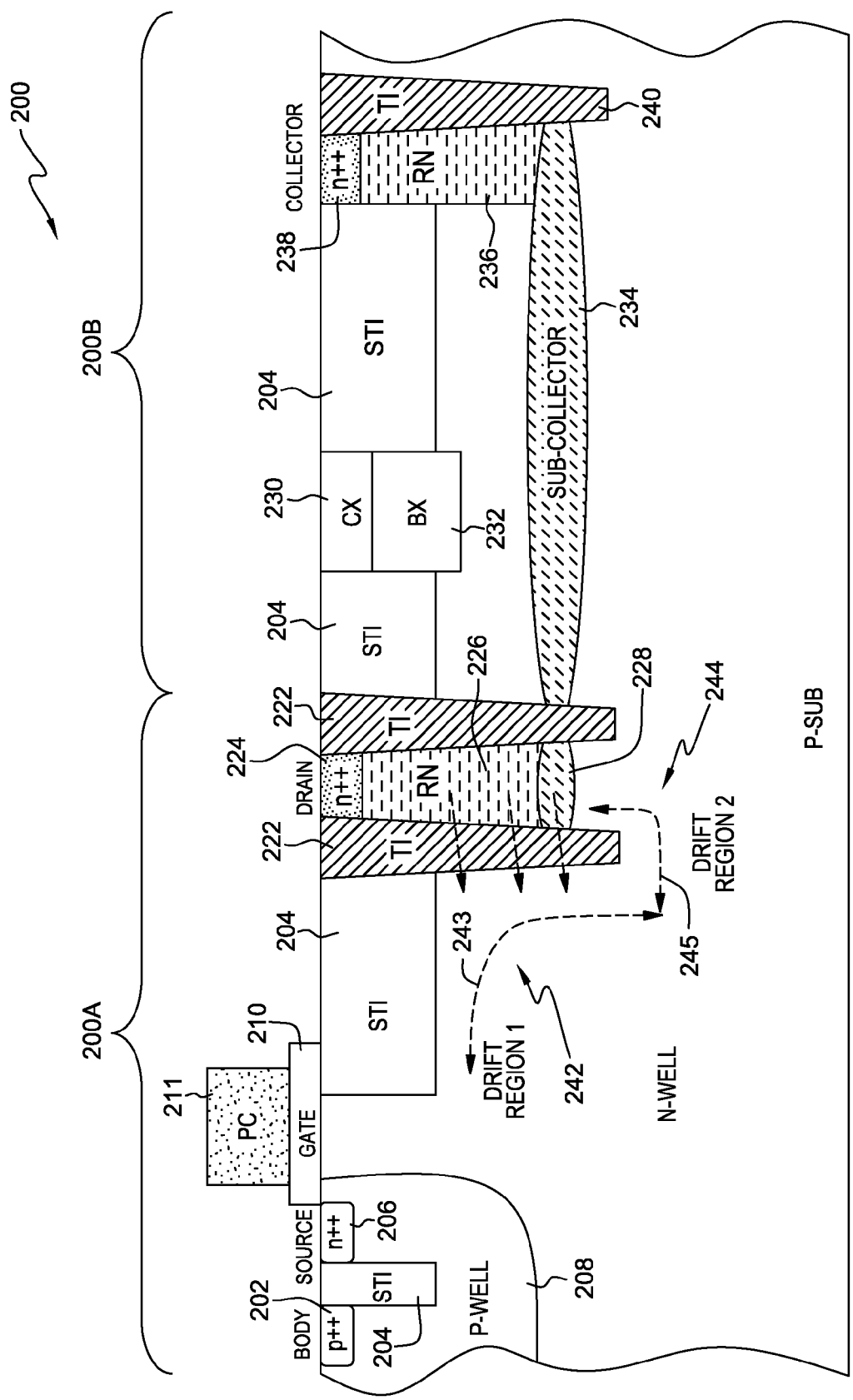
FIG. 2 is a diagram showing dual L-shaped drift regions in a BiCMOS device, in accordance with a first exemplary embodiment of the present invention.

FIG. 2 is a diagram showing dual L-shaped drift regions in BiCMOS device 200, in accordance with a first exemplary embodiment of the present invention. BiCMOS device 200 includes LDMOS 200A and bipolar transistor 200B. LDMOS 200A includes P-type body contact region 202, shallow trench isolation 204, N-type source region 206, and P-well 208. LDMOS 200A further includes gate 210, poly gate deposition 211, and N-type drain 224. N-type drain 224 is surrounded by trench isolation (TI) 222. For example, trench isolation (TI) 222 reaches a depth of more than 2 μm vertically into the body of N-well for voltage drop, thus making the electric field deplete vertically and laterally. Reach-through (RN) 226 is below N-type drain 224 and surrounded by TI 222. Shared sub-collector implant 228 is located below reach-through (RN) 226 and also surrounded by TI 222. Reach-through (RN) 226, which is formed by ion implantation, links N-type drain 224 and shared sub-collector implant 228.

Referring to FIG. 2, drift region 1 242 is in N-well located below STI 204 and between N-type drain 224 and P-well 208. Drift region 1 242 is formed by additional N-type doping in N-well, along a path indicated by dashed line 243. Drift region 1 242 comprises a substantially lateral section and a substantially vertical section of dashed line 243; the two sections form an L-shaped draft region in LDMOS 200A. The substantially lateral section extends substantially in the lateral direction. The lateral direction is a direction parallel to a top surface of a semiconductor substrate. The substantially vertical section extends substantially parallel to TI 222 and in the vertical direction. The vertical direction is a direction perpendicular to a top surface of a semiconductor substrate.

Referring to FIG. 2, drift region 2 244 is in N-well located below TI 222 and shared sub-collector implant 228 in LDMOS 200A. Drift region 2 244 is formed by additional N-type doping in N-well along a path indicated by dashed-line 245. The doping can be made by out-diffusion of the ion implant from shared sub-collector 228 or dedicated ion implant. Similar to drift region 1 242, drift region 2 244 also comprises a substantially lateral section and a substantially vertical section of dashed line 243; the two sections forms another L-shaped drift region in LDMOS 200A. The substantially lateral section is below TI 222 of LDMOS 200A and extends substantially in the lateral direction. The substantially vertical section of L-shaped drift region 2 244 is below shared sub-collector implant 228, and extends substantially parallel to TI 222 in the vertical direction.

Referring to FIG. 2, drift region 2 244 connects to drift region 1 242. The substantially lateral section of drift region 2 244 connects to the substantially vertical section of drift region 1 242. Both drift region 1 242 and drift region 2 244 form the dual L-shaped drift regions in LDMOS 200A.

Referring to FIG. 2, bipolar transistor 200B includes shallow trench isolation 204, selectively implanted collector 230, sub-collector implant 232, collector 238, sub-collector 234, reach-through 236, and trench isolation (TI) 240. Reach-through 236, which is formed by ion implantation, links collector 238 and sub-collector 234. Bipolar transistor 200B further includes an emitter and a base which are shown in FIG. 8F.

Figure 3:
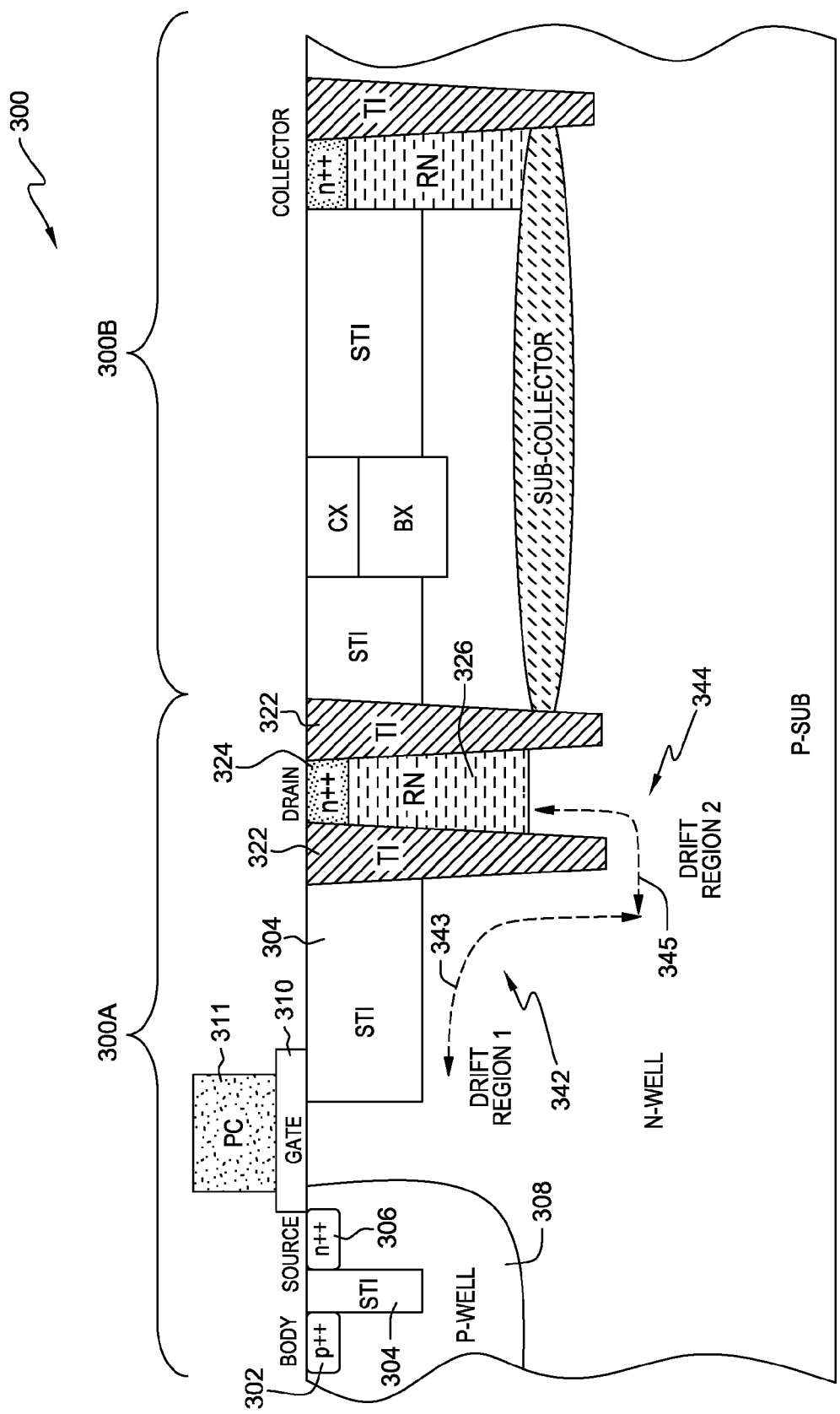
FIG. 3 is a diagram showing dual L-shaped drift regions in a BiCMOS device, in accordance with a second exemplary embodiment of the present invention.

FIG. 3 is a diagram showing dual L-shaped drift regions in BiCMOS device 300, in accordance with a second exemplary embodiment of the present invention. BiCMOS device 300 includes LDMOS 300A and bipolar transistor 300B. Bipolar transistor 300B has the same structure as bipolar transistor 200B shown in FIG. 2. The following structures in LDMOS 300A are the same as in LDMOS 200A shown in FIG. 2: P-type body contact region 302, shallow trench isolation 304, N-type source region 306, P-well 308, gate 310, poly gate deposition 311, trench isolation (TI) 322, N-type drain 324, and reach-through 326. Structurally the same as LDMOS 200A, N-type drain 324 and reach through 326 are surrounded by TI 322. While LDMOS 200A includes shared sub-collector implant 228 which is located below reach-through (RN) 226, LDMOS 300A has no shared sub-collector implant below reach-through 326. Reach-through 326, formed by ion implantation, links N-type drain 324 and drift region 2 344.

Referring to FIG. 3, LDMOS 300A includes drift region 1 342 and drift region 2 344. Drift region 1 342 and drift region 2 344 form the dual L-shaped drift regions in LDMOS 300A of BiCMOS device 300.

Referring to FIG. 3, drift region 1 342 is located below STI 304 and between N-type drain 324 and P-well 308. Drift region 1 342 is formed by additional N-type doping in N-well, along dashed-line 343. A substantially lateral section and a substantially vertical section of dashed line 343 form an L-shaped drift region. The substantially lateral section extends substantially in the lateral direction. The lateral direction is a direction parallel to a top surface of a semiconductor substrate. The substantially vertical section extends substantially parallel to TI 322 of LDMOS 300A and in the vertical direction. The vertical direction is a direction perpendicular to a top surface of a semiconductor substrate.

Referring to FIG. 3, drift region 2 344 is in N-well located below TI 322 and reach-through 326 in LDMOS 300A. Drift region 2 344 is formed by additional N-type doping in N-well along a path indicated by dashed-line 345. Therefore, drift region 2 344 comprises a substantially lateral section and a substantially vertical section of dashed line 345. The two sections form another L-shaped drift region in LDMOS 300A. The substantially lateral section is below TI 322 of LDMOS 300A and extends substantially in the lateral direction. The substantially vertical section is below reach through 326 and extends substantially parallel to TI 322 in the vertical direction.

Figure 4:
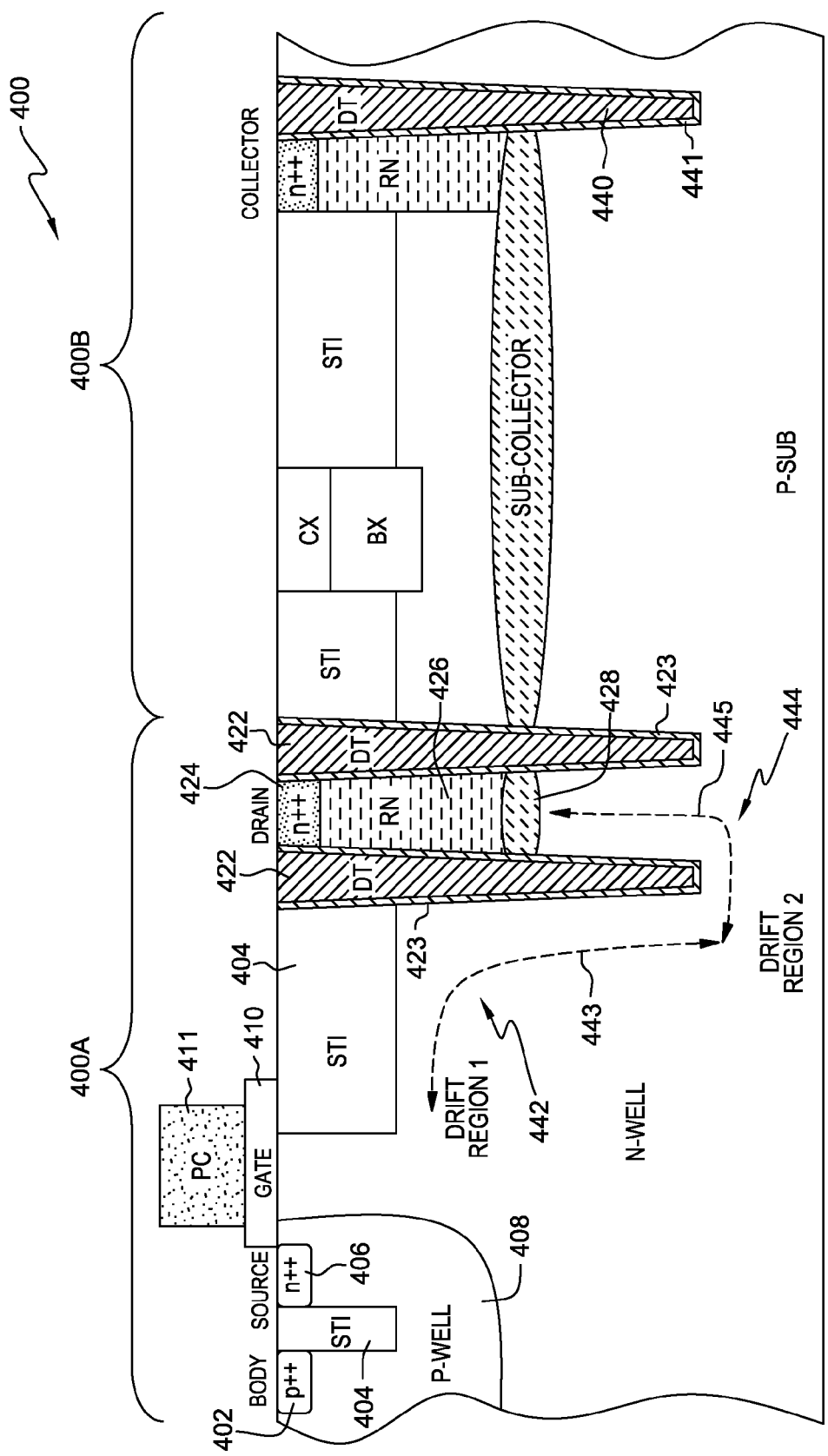
FIG. 4 is a diagram showing dual L-shaped drift regions in a BiCMOS device, in accordance with a third exemplary embodiment of the present invention.

FIG. 4 is a diagram showing dual L-shaped drift regions in BiCMOS device 400, in accordance with a third exemplary embodiment of the present invention. BiCMOS device 400 includes LDMOS 400A and bipolar transistor 400B. The following structures in LDMOS 400A are the same as in LDMOS 200A: P-type body contact region 402, shallow trench isolation 404, N-type source region 406, P-well 408, gate 410, poly gate deposition 411, deep trench (DT) 422, N-type drain 424, reach-through 426, and shared sub-collector implant 428. Reach-through 426, which is formed by ion implantation, links N-type drain 424 and shared sub-collector implant 428. Unlike LDMOS 200A, N-type drain 424, reach-through 426, and shared sub-collector implant 428 are surrounded by deep trench (DT) 422 which is encapsulated by deep trench liner 423.

Referring to FIG. 4, LDMOS 400A includes drift region 1 442 and drift region 2 444. Both drift region 1 442 and drift region 2 444 form the dual L-shaped drift regions in LDMOS 400A of BiCMOS device 400.

Referring to FIG. 4, drift region 1 442 is located below STI 404 and between N-type drain 424 and P-well 408. Drift region 1 442 is formed by additional N-type doping in N-well, along dashed-line 443. A substantially lateral section and a substantially vertical section of dashed line 443 form an L-shaped drift region. The substantially lateral section is in a direction substantially parallel to a top surface of a semiconductor substrate. The substantially vertical section extends substantially parallel to DI 422 of LDMOS 400A in the vertical direction. The substantially vertical section is in a direction substantially perpendicular to a top surface of a semiconductor substrate.

Referring to FIG. 4, drift region 2 444 is in N-well located below DI 422 and shared sub-collector implant 428 in LDMOS 400A. Drift region 2 444 is formed by additional N-type doping in N-well along a path indicated by dashed-line 445. The doping can be made by out-diffusion of an ion implant from shared sub-collector 428 or a dedicated ion implant. Therefore, drift region 2 444 comprises a substantially lateral section and a substantially vertical section of dashed line 445. The two sections form another L-shaped drift region in LDMOS 400A. The substantially lateral section is below DI 422 of LDMOS 400A and is in a direction substantially parallel to a top surface of a semiconductor substrate. The substantially vertical section is below shared sub-collector implant 428, and extends substantially parallel to DI 422 in a direction substantially perpendicular to a top surface of a semiconductor substrate.

Referring to FIG. 4, bipolar transistor 400B in BiCMOS device 400 has similar structures to bipolar transistor 200B in BiCMOS device 200 shown in FIG. 2. Bipolar transistor 400B has deep trench (DT) 440 encapsulated by deep trench liner 441, instead of a trench isolation such as TI 240 in bipolar transistor 200B. All other structures in bipolar transistor 400B are the same as in bipolar transistor 200B.

Figure 5:
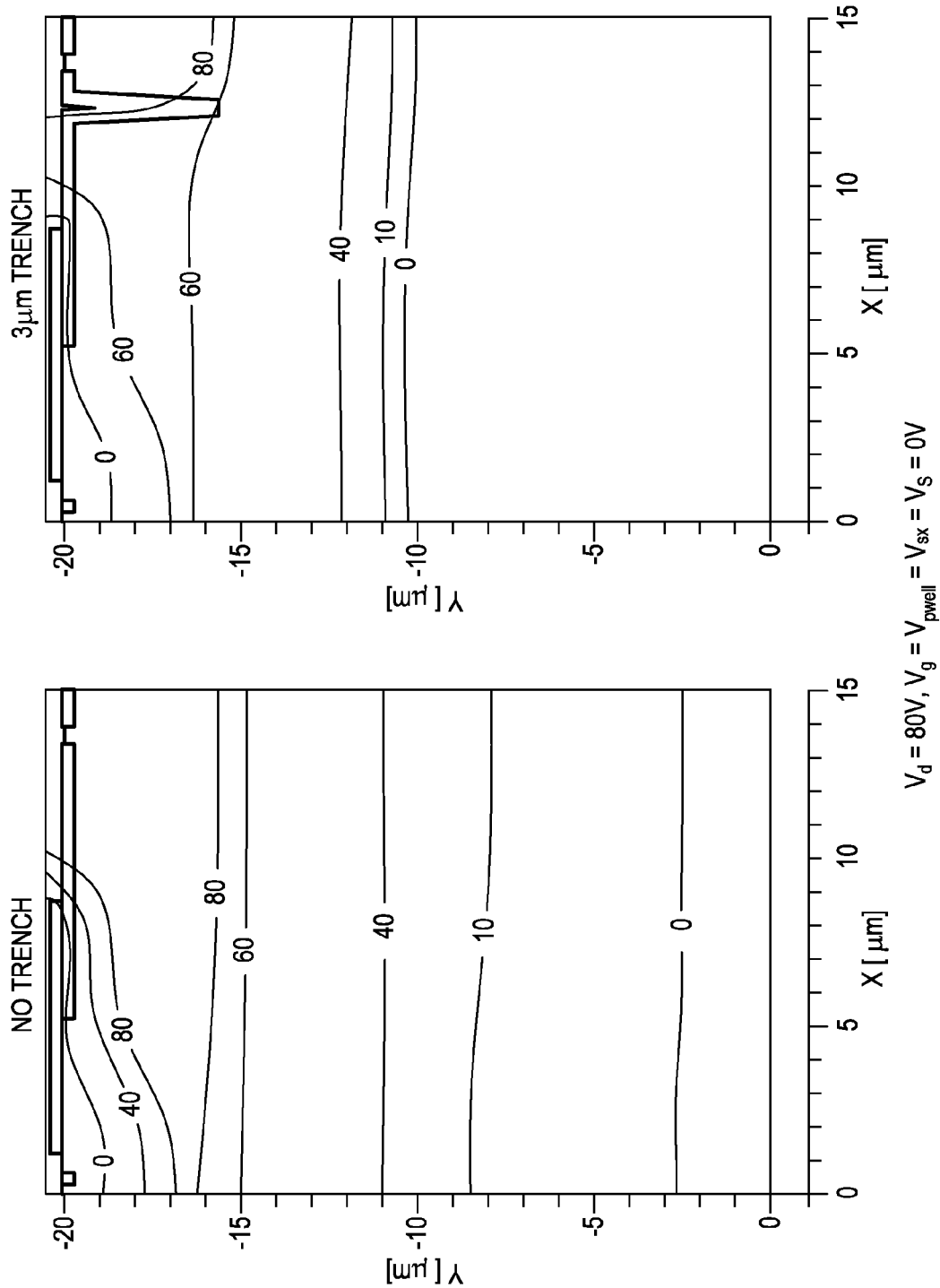
FIG. 5 presents electrical simulation results showing electric potentials in a traditional LDMOS and an exemplary LDMOS in the present invention.

FIG. 5 presents electrical simulation results showing electric potentials in a traditional LDMOS which has no trench and an exemplary LDMOS with one 3-μm trench isolation in this present invention. In the simulations of the traditional LDMOS and the exemplary LDMOS of this present invention, the electrical potential at drain ($V_d$) is 80 V, the electrical potentials at gate ($V_g$), at P-well ($V_{pwell}$), at the substrate ($V_{sx}$), and at N-type source region ($V_s$) are zero. FIG. 5 shows equipotential lines in the traditional LDMOS (without trench isolation) and the exemplary LDMOS (with 3-μm trench isolation) of this invention. The simulation results indicate that the exemplary LDMOS of this invention furnishes a much higher voltage drop in the lateral direction within a much shorter distance from the drain than the traditional LDMOS does.

Figure 6:
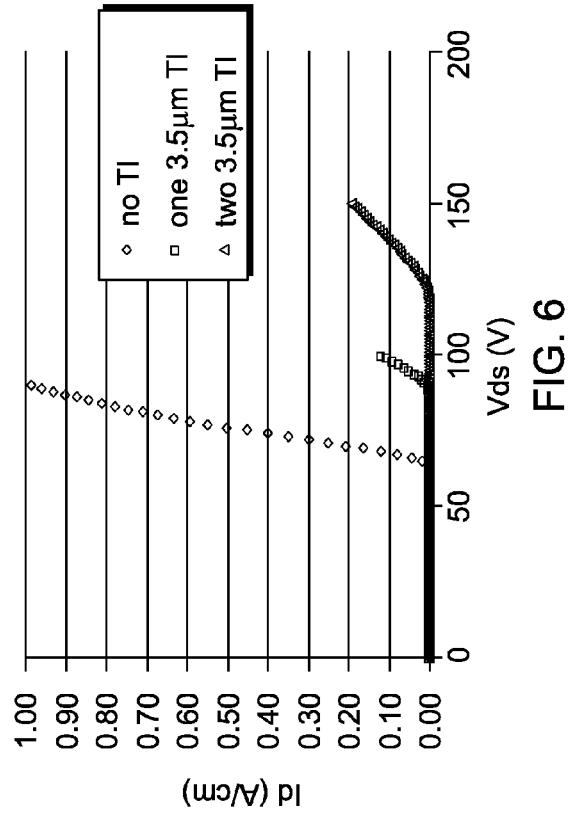
FIG. 6 presents electrical simulation results showing drain current versus breakdown voltage for a traditional LDMOS and two exemplary LDMOSs of the present invention.

FIG. 6 presents electrical simulation results showing drain current versus breakdown voltage for a traditional LDMOS (which has no trench isolation) and two exemplary LDMOSs of this present invention (one has one 3.5-μm trench isolation and the other has two 3.5-μm trench isolations). FIG. 6 presents simulation results on a graph of the drain current in A/cm versus the breakdown voltage in V. The simulation indicates that the breakdown voltage increases as the number of trench isolation (TI) increases.

Figure 7:
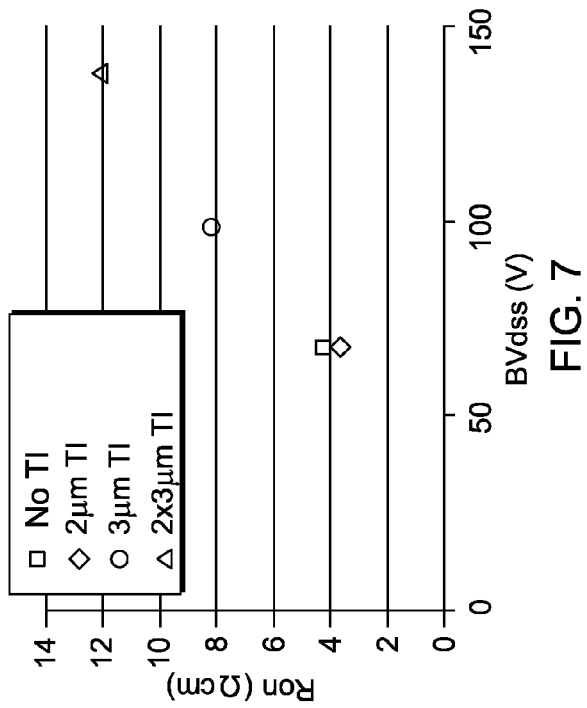
FIG. 7 presents electrical simulation results showing on-resistance ($R_{on}$) versus breakdown voltage for a traditional LDMOS and three exemplary LDMOSs of the present invention.

FIG. 7 presents electrical simulation results showing on-resistance ($R_{on}$) versus breakdown voltage ($BV_{dss}$) for a traditional LDMOS (which has no trench isolation) and three exemplary LDMOSs of this present invention (the first has one 2-μm trench isolation, the second has one 3-μm trench isolation, the third has two 3-μm trench isolations). FIG. 7 presents simulation results on a graph of the on-resistance $R_{ON}$ in Ω·cm versus the breakdown voltage in V. The graph shows the tradeoff of key resistance metric—$R_{ON}$ with $BV_{dss}$.

FIGS. 8A-8F are diagrams showing a process of making BiCMOS device 200 shown in FIG. 2, in accordance with an exemplary embodiment in the present invention. BiCMOS device 200 is made on P-type substrate 801 shown in FIG. 8A.

Figure 8B:
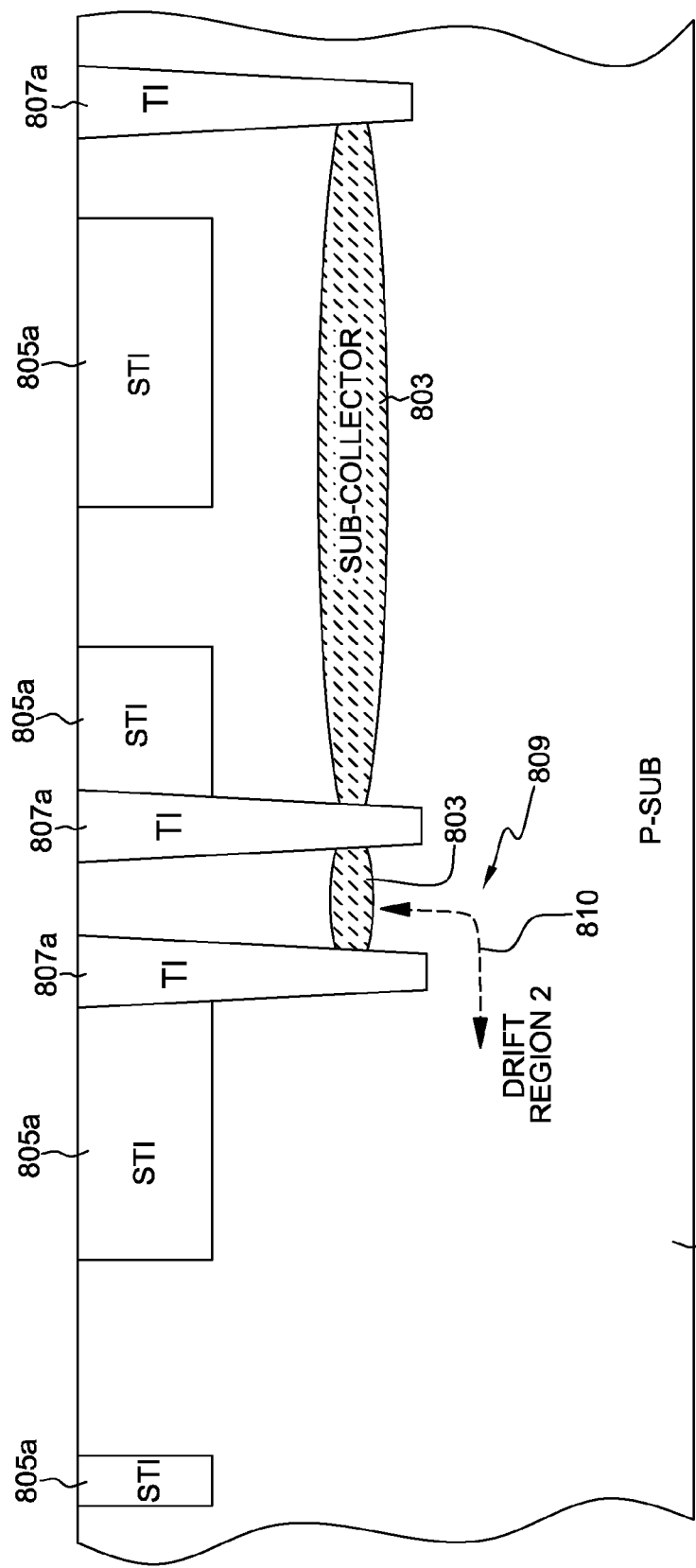

Making BiCMOS device 200 includes the following steps, referring to FIG. 8B. Sub-collector 803 is made through ion implantation and annealing. Shallow trench 805a is formed. Trench 807a is formed through an etch process. Drift region 2 809 is implanted through additional N-type doping along dashed-line 810. The doping can be made by out-diffusion of an ion implant from sub-collector 803 or dedicated ion implant. Drift region 2 809 includes a substantially lateral section and a substantially vertical section of dashed line 810; the two sections form the second L-shaped drift region under trench 807a.

Figure 8C:
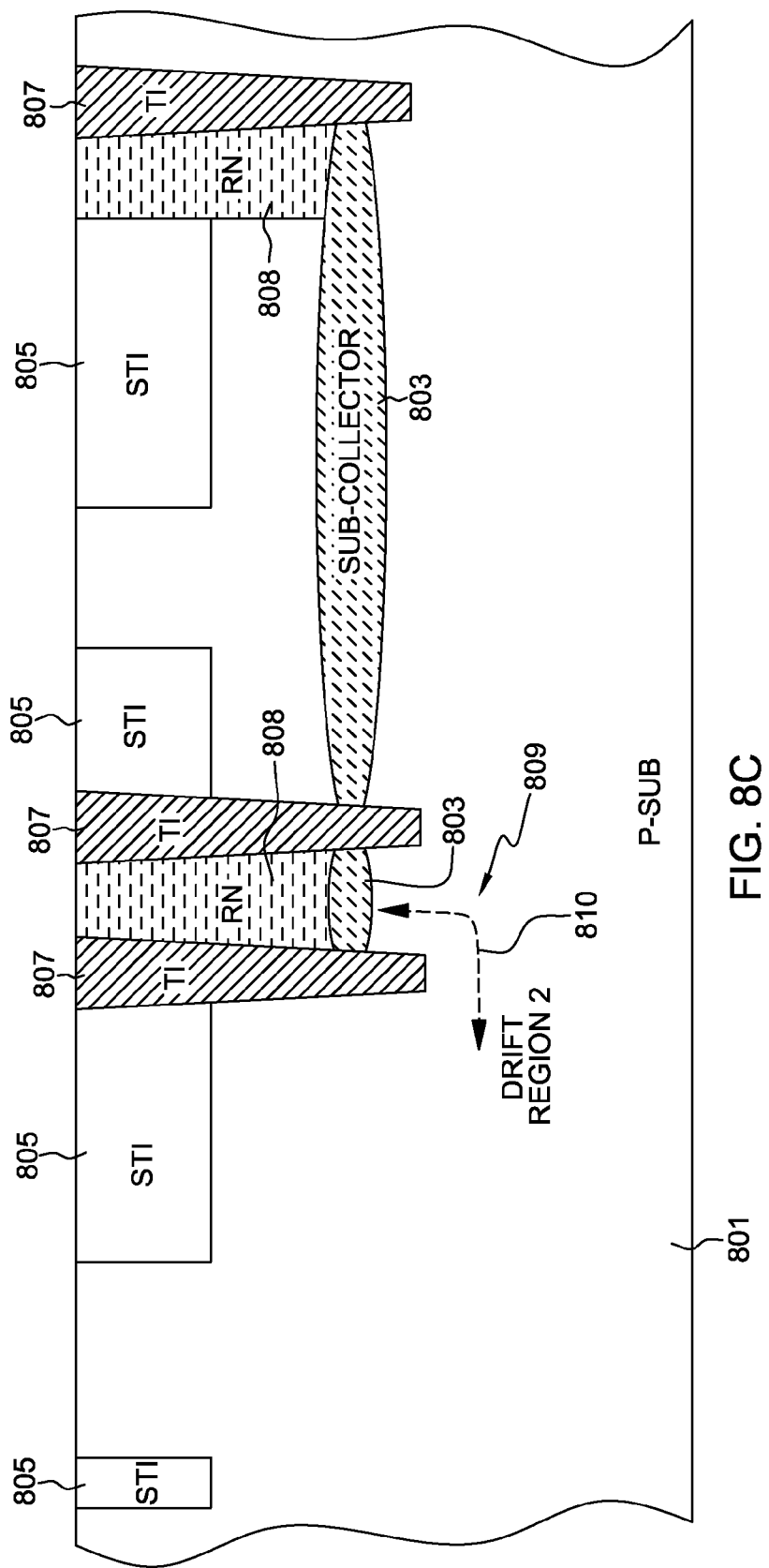

Making BiCMOS device 200 further includes the following steps, referring to FIG. 8C. Shallow trench 805a and trench 807a shown in FIG. 8B are filled with one or more dielectric materials (such as silicon dioxide), and the excess dielectric materials are removed through chemical-mechanical planarization. Thus, shallow trench isolation (STI) 805 and trench isolation (TI) 807 are formed. Reach-through 808 is formed through ion implantation.

Figure 8D:
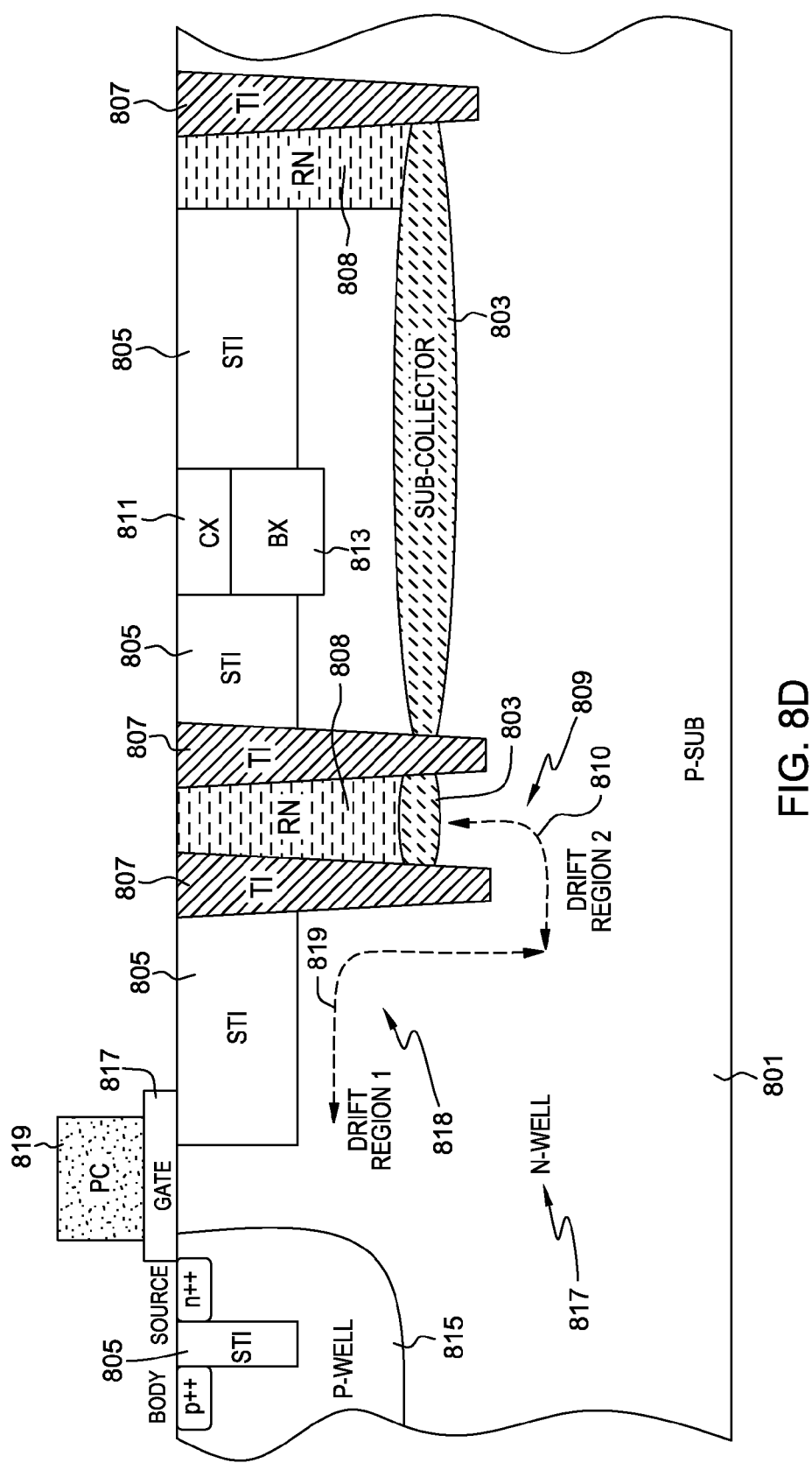

Making BiCMOS device 200 further includes the following steps, referring to FIG. 8D. Selectively implanted collector (CX) 811 and sub-collector implant (BX) 813 of the bipolar transistor are formed though photolithography, etching, and epitaxial growth processes. N-well 817 and P-well 815 of the LDMOS are formed though photolithography, etching, and epitaxial growth processes. Drift region 1 818 is implanted through additional N-type doping along dashed-line 819. Drift region 1 818 includes a substantially lateral section and a substantially vertical section of dashed line 819; the two sections form the first L-shaped drift region. Gate 817 is formed by the growth of gate oxide and polysilicon deposition (PC) 819 is formed on the top of gate 817.

Figure 8E:
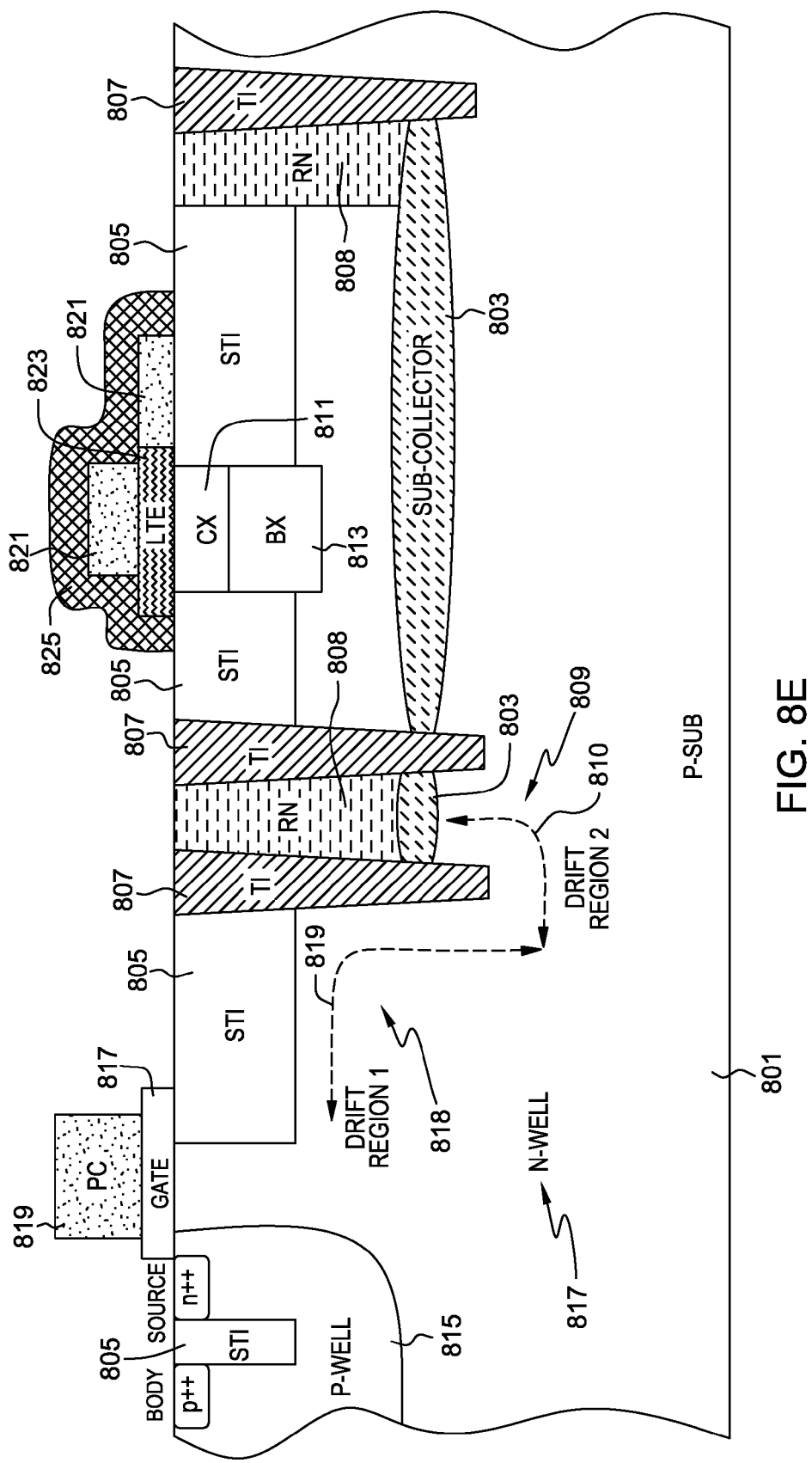
Figure 8F:
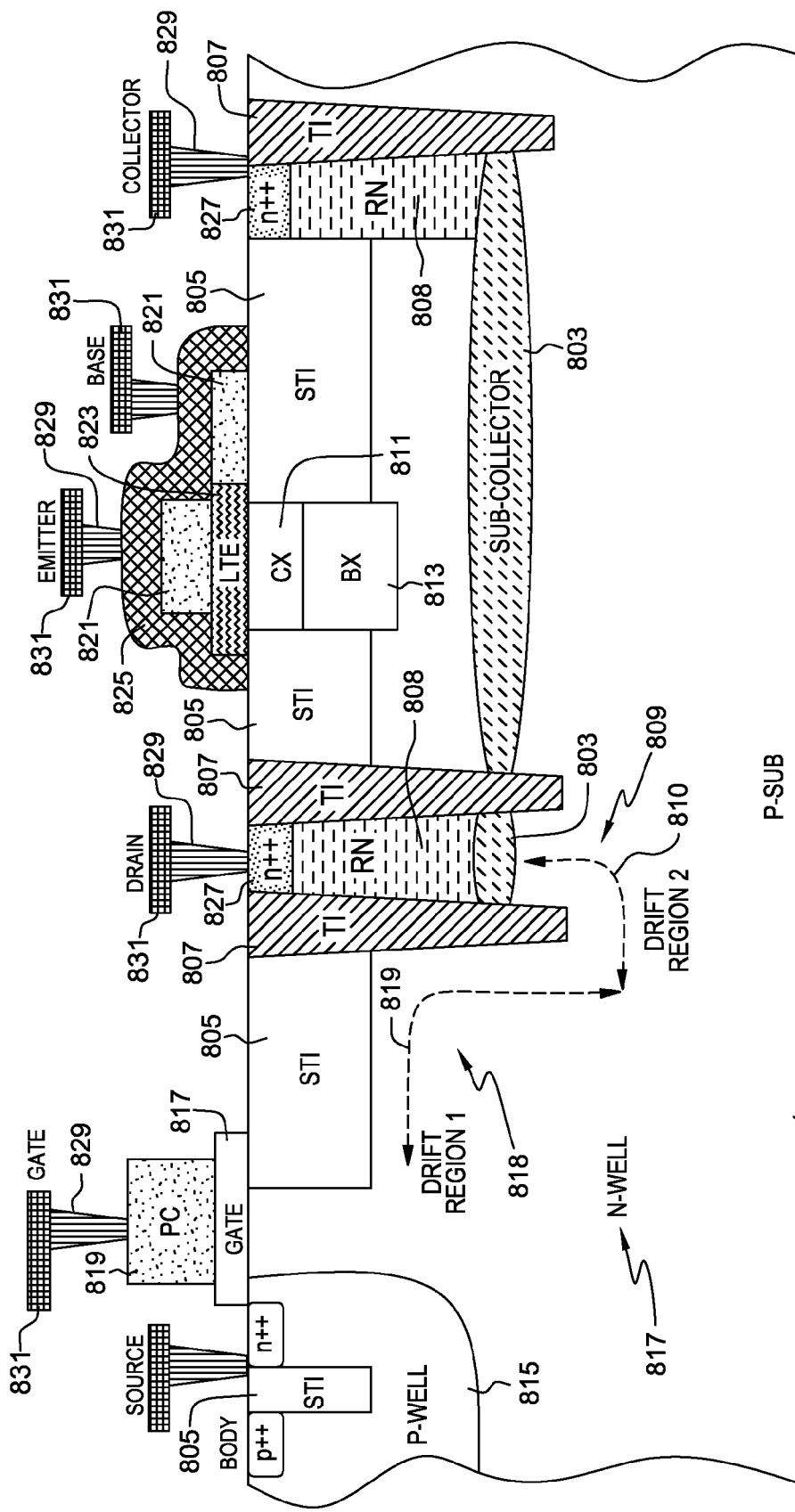

Making BiCMOS device 200 further includes the following steps, referring to FIG. 8E. The base of the bipolar transistor and emitter low temperature epitaxy (LTE) 823 are formed by an epitaxial growth processes. By a chemical vapor deposit (CVD) process, emitter polysilicon deposition 821 is grown on the top of LTE 823, and then emitter polysilicon deposition 821 is covered by emitter cap dielectric layer 825.

Making BiCMOS device 200 further includes the following steps, referring to FIG. 8F. Source and drain ion implant is complete through processes of photolithography, etching, and implanting desired species. Contact level 829 (from the source or the drain up to first metal level 831) is formed through processes of photolithography, drilling a hole, and filling with W. First metal level 831 is formed through processes of photolithography, etching, filling metal(s) (such as Al, Cu, a compound of Al and Cu, or a compound of Cu and Mn), and polishing.

Having described preferred embodiments of a tunable semiconductor device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A semiconductor device, comprising:
   a lateral diffused metal oxide semiconductor (LDMOS) comprising, in a first well with a first conductivity type, a trench isolation region, a first L-shaped drift region, and a second L-shaped drift region, wherein the first L-shaped drift region and the second L-shaped drift region are formed by additional doping of the first conductivity type;
   the trench isolation region surrounding a drain region and extending down in the first well in a substantially vertical direction;
   the first L-shaped drift region comprising a first section and a second section;
   the first section extending in a substantially lateral direction, a first end of the first section adjacent to the trench isolation region, a second end of the first section extending to a second well with a second conductivity type, the second well surrounding a body region and a source region;
   the second section extending down in the first well in the substantially vertical direction and being substantially parallel to the trench isolation region, an upper end of the second section connecting to the first end of the first section;
   the second L-shaped drift region comprising a third section and a fourth section;
   the third section extending in the substantially lateral direction and below a lower end of the trench isolation region, a first end of the third section connecting to a lower end of the second section; and
   the fourth section extending in the substantially vertical direction and surrounded by a lower section of the trench isolation region, a lower end of the fourth section connecting to a second end of the third section.

2. The semiconductor device of claim 1, further comprising:
   a reach through below the drain region;
   a shared sub-collector region below the reach through, the shared sub-collector region sharing with a sub-collector of a bipolar transistor in a BiCMOS device;
   wherein the reach through and the shared sub-collector region are surrounded by the trench isolation region; and
   wherein an upper end of the fourth section extends to the shared sub-collector region.

3. The semiconductor device of claim 1, further comprising:
   a reach through below the drain region;
   wherein the reach through is surrounded by the trench isolation region; and
   wherein an upper end of the fourth section extends to the reach through.

4. The semiconductor device of claim 1, wherein the first conductivity type is N-type, and wherein the second conductivity type is P-type.

5. The semiconductor device of claim 1, wherein the drain region is N-type, the source region is N-type, and the body region is P-type.

6. The semiconductor device of claim 1, wherein the trench isolation region is filled with dielectric.

7. A semiconductor device, comprising:
   a lateral diffused metal oxide semiconductor (LDMOS) comprising, in a first well with a first conductivity type, a deep trench encapsulated by a liner, a first L-shaped drift region, and a second L-shaped drift region, wherein the first L-shaped drift region and the second L-shaped drift region are formed by additional doping of the first conductivity type;
   the deep trench surrounding a drain region and extending down in the first well in a substantially vertical direction;
   the first L-shaped drift region comprising a first section and a second section;
   the first section extending in a substantially lateral direction, a first end of the first section adjacent to the deep trench, a second end of the first section extending to a second well with a second conductivity type, the second well surrounding a body region and a source region;
   the second section extending down in the first well in the substantially vertical direction and being substantially parallel to the deep trench, an upper end of the second section connecting to the first end of the first section;
   the second L-shaped drift region comprising a third section and a fourth section;
   the third section extending in the substantially lateral direction and below a lower end of the deep trench, a first end of the third section connecting to a lower end of the second section; and
   the fourth section extending in the substantially vertical direction and surrounded by a lower section of the deep trench, a lower end of the fourth section connecting to a second end of the third section.

8. The semiconductor device of claim 7, further comprising:
   a reach through below the drain region;
   a shared sub-collector region below the reach through, the shared sub-collector region sharing with a sub-collector of a bipolar transistor in a BiCMOS device;
   wherein the reach through and the shared sub-collector region are surrounded by the deep trench; and
   wherein an upper end of the fourth section extends to the shared sub-collector region.

9. The semiconductor device of claim 7, further comprising:
   a reach through below the drain region;
   wherein the reach through is surrounded by the deep trench; and
   wherein an upper end of the fourth section extends to the reach through.

10. The semiconductor device of claim 7, wherein the first conductivity type is N-type, and wherein the second conductivity type is P-type.

11. The semiconductor device of claim 7, wherein the drain region is N-type, the source region is N-type, and the body region is P-type.

12. The semiconductor device of claim 7, wherein the deep trench is filled with dielectric, and wherein the liner is dielectric.

13. A method of making a lateral diffused metal oxide semiconductor (LDMOS) with dual L-shaped drift regions, the method comprising:

forming, in a first well with a first conductivity type, a trench isolation region or a deep trench encapsulated by a liner, wherein the trench isolation region or the deep trench surrounds a drain region and extends down in the first well in a substantially vertical direction;

forming, in the first well, a first L-shaped drift region comprising a first section and a second section, wherein the first section extends in a substantially lateral direction, wherein a first end of the first section is adjacent to the trench isolation region or the deep trench, wherein a second end of the first section extends to a second well with a second conductivity type, wherein the second well surrounds a body region and a source region, wherein the second section extends down in the first well in the substantially vertical direction and is substantially parallel to the trench isolation region or the deep trench, wherein an upper end of the second section connecting to the first end of the first section;

forming, in the first well, a second L-shaped drift region comprising a third section and a fourth section, wherein the third section extends in the substantially lateral direction and is below a lower end of the trench isolation region or the deep trench, wherein a first end of the third section connects to a lower end of the second section, wherein the fourth section extends in the substantially vertical direction and is surrounded by a lower section of the trench isolation region or the deep trench, wherein a lower end of the fourth section connects to a second end of the third section; and wherein the first L-shaped drift region and the second L-shaped drift region are formed by additional doping of the first conductivity type.

14. The method of claim 13, wherein a reach through is below the drain region, a shared sub-collector region is below the reach through, the shared sub-collector region shares with a sub-collector of a bipolar transistor in a BiCMOS device, the reach through and the shared sub-collector region are surrounded by the trench isolation region or the deep trench, and an upper end of the fourth section extends to the shared sub-collector region.

15. The method of claim 13, wherein a reach through is below the drain region, the reach through is surrounded by the trench isolation region or the deep trench, and an upper end of the fourth section extends to the reach through.

16. The method of claim 13, wherein the first conductivity type is N-type and the second conductivity type is P-type, wherein the drain region is N-type, the source region is N-type, and the body region is P-type.

17. The method of claim 13, wherein the trench isolation region or the deep trench is filled with dielectric, and wherein the liner is dielectric.

* * * * *